United States Patent
Saxena et al.

(10) Patent No.: US 10,107,859 B1
(45) Date of Patent: Oct. 23, 2018

(54) DETERMINING TEST CONDITIONS FOR AT-SPEED TRANSITION DELAY FAULT TESTS ON SEMICONDUCTOR DEVICES

(71) Applicant: ANORA LLC, Plano, TX (US)

(72) Inventors: Jayashree Saxena, Richardson, TX (US); Jeremy Lee, Ellicott City, MD (US); Pramodchandran Variyam, Plano, TX (US)

(73) Assignee: Anora LLC, Plano, TX (US)

( * ) Notice: Subject to any disclaimer, the term of this patent is extended or adjusted under 35 U.S.C. 154(b) by 395 days.

(21) Appl. No.: 15/085,241

(22) Filed: Mar. 30, 2016

Related U.S. Application Data

(60) Provisional application No. 62/151,876, filed on Apr. 23, 2015.

(51) Int. Cl.
- *G06F 11/22* (2006.01)
- *G06F 17/50* (2006.01)
- *G01R 31/3177* (2006.01)
- *G01R 31/317* (2006.01)

(52) U.S. Cl.
CPC ... *G01R 31/3177* (2013.01); *G01R 31/31727* (2013.01)

(58) Field of Classification Search
USPC .......................................................... 716/136
See application file for complete search history.

(56) References Cited

U.S. PATENT DOCUMENTS

| | | | |
|---|---|---|---|
| 6,651,227 B2 | 11/2003 | Abadir et al. | |
| 2015/0199461 A1* | 7/2015 | Laisne | G06F 17/5031 716/108 |

\* cited by examiner

*Primary Examiner* — Eric Lee
(74) *Attorney, Agent, or Firm* — Alliance IP, LLC

(57) ABSTRACT

An example method for determining test conditions for at-speed transition delay fault tests on semiconductor devices is provided and includes analyzing scan patterns for testing a circuit of a device-under-test (DUT), identifying paths in the circuit activated by the scan patterns, determining behavior of the paths at different test corners, generating a histogram for each scan pattern representing a distribution of paths exhibiting worst-case behavior at corresponding test corners, generating an ordered set of scan pattern-test corner combinations based on the histogram, selecting a threshold for the ordered scan pattern-test corner combinations based on quality metrics, generating an ordered test set including the ordered scan pattern-test corner combinations with the selected threshold, and feeding the ordered test set to a test instrument, the test instrument testing the DUT according to the ordered test set, the tests being performed at the test corners listed above the selected threshold.

20 Claims, 12 Drawing Sheets

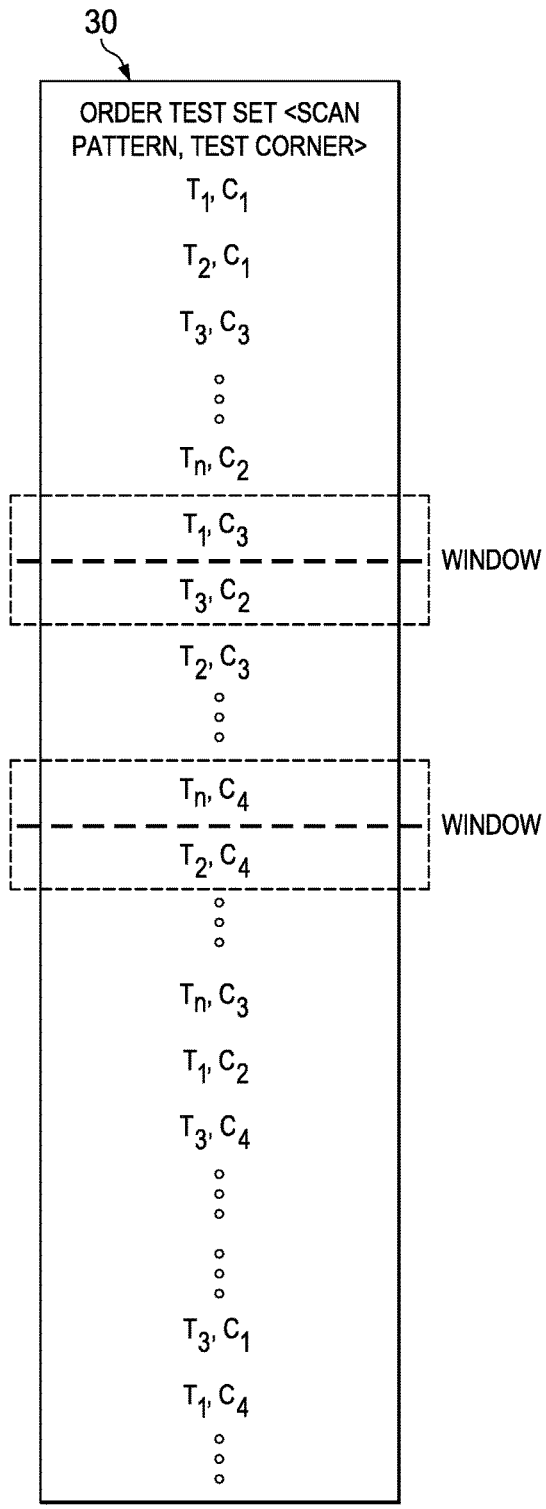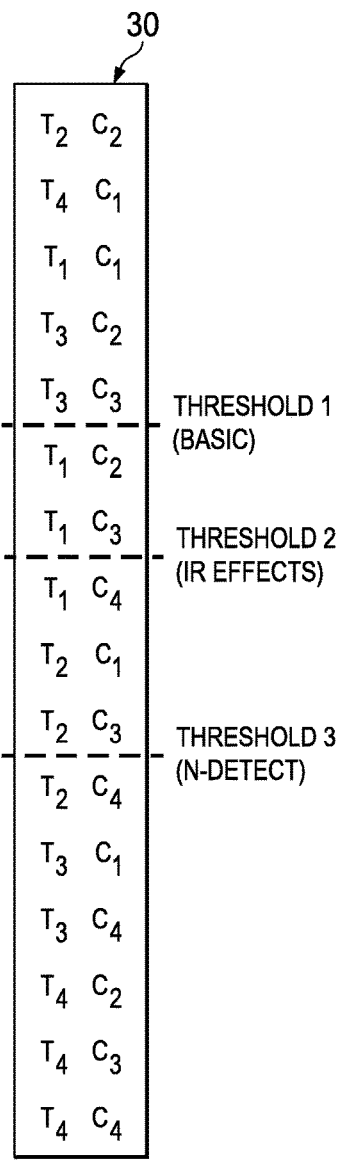
FIG. 7
FIG. 8

DETERMINING TEST CONDITIONS FOR AT-SPEED TRANSITION DELAY FAULT TESTS ON SEMICONDUCTOR DEVICES

CROSS-REFERENCE TO RELATED APPLICATION

This application claims the benefit of priority under 35 U.S.C. § 119(e) to U.S. Provisional Patent Application Ser. No. 62/151,876, filed on Apr. 23, 2015 and entitled PRE-SILICON TECHNIQUE TO DETERMINE EFFECTIVE VOLTAGE AND TEMPERATURE TEST CONDITIONS FOR AT-SPEED TRANSITION FAULT TESTS, the disclosure of which is hereby incorporated by reference in its entirety.

TECHNICAL FIELD

This disclosure relates in general to the field of semiconductor testing and, more particularly, to determining test conditions for at-speed transition delay fault tests on semiconductor devices.

BACKGROUND

Verifying correct operation of digital logic circuits at their expected clock rate (e.g., speed) remains an important activity for semiconductor manufacturers when testing semiconductor devices. Defects that cause digital logic circuits to malfunction at expected clock rates are modeled as delay faults. Delay faults cause errors in the functioning of the digital logic circuits based on timing. They are typically caused by increases in finite rise and fall times of electrical signals at Boolean gates of semiconductor elements and propagation delay of interconnects between the gates. In a general sense, at-speed behavior of digital logic circuits is emulated to detect and characterize such delay faults. One of several fault models that have been proposed for emulating and testing delay faults is the transition fault model. The transition fault model assumes that gate delays and interconnect delays on all paths passing through a particular site manifest themselves as a gross delay at that site, called a fault site. Hence, sensitizing any path that passes through the fault site is enough to detect the fault. Today, scan-based testing techniques using the transition fault model are increasingly used to test for delay faults.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 7 is a simplified block diagram illustrating yet other example details of embodiments of the system;

FIG. 8 is a simplified block diagram illustrating yet other example details of embodiments of the system;

DETAILED DESCRIPTION OF EXAMPLE EMBODIMENTS

Overview

An example method for determining test conditions for at-speed transition delay fault tests on semiconductor devices is provided and includes analyzing scan patterns for testing a circuit of a device under test, identifying paths in the circuit that are activated by the scan patterns, determining behavior of the paths at different test corners, generating a histogram for each scan pattern representing a distribution of paths exhibiting worst-case behavior at corresponding test corners, generating an ordered set of scan pattern-test corner combinations based on the histogram, selecting a threshold for the ordered scan pattern-test corner combinations based on quality metrics, the ordered scan pattern-test corner combinations above the threshold being associated with higher defect levels and the ordered scan pattern-test corner combinations below the threshold being associated with lower defect levels, generating an ordered test set including the ordered scan pattern-test corner combinations with the selected threshold, and feeding the ordered test set to a test instrument. The test instrument tests the device under test according to the ordered test set, with the tests being performed at the test corners listed above the selected threshold using the corresponding scan patterns of the scan pattern-test corner combinations.

As used herein, the term "test corner" refers to a specific combination of supply voltage and temperature. For example, a combination of supply voltage V1 and temperature T1 is a first test corner; another combination of supply voltage V2 and temperature T2 is a different, second test corner. As used herein, the term "scan pattern" refers to a set of logic values (e.g., 0, 1) applied to a digital logic circuit (e.g., through a chain of flip-flops) in the form of voltage or current signals varying in time. For example, a voltage signal representing a logic 1 at time $t_0$, logic 0 at time $t_1$, logic 1 at time $t_2$, etc., comprises an example scan pattern (e.g., 101010 . . . ). A "path" refers to a continuous electrical signal flow channel between two points; the path can comprise electrical conductors (e.g., interconnects), logic gates (e.g., of semiconductor devices) and passive components (e.g., resistors). Other terms have standard meanings comprehensible to persons of ordinary skill in the art.

Example Embodiments

Figure 1:
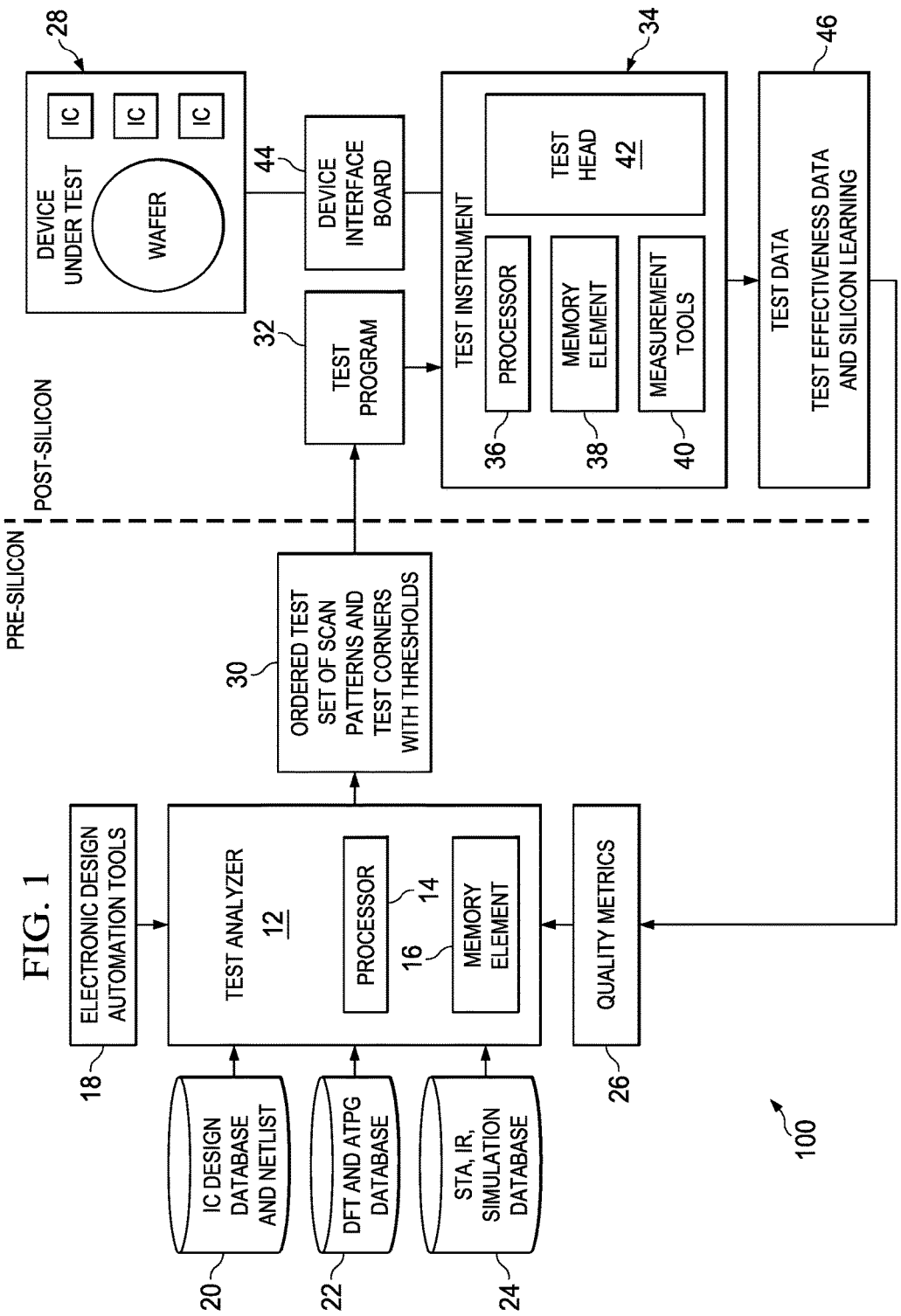
FIG. 1 is a simplified block diagram illustrating a system for determining test conditions for at-speed transition delay fault tests on semiconductor devices according to an example embodiment.

Turning to FIG. 1, FIG. 1 is a simplified block diagram illustrating a system 10 for determining test conditions for at-speed transition delay fault tests on semiconductor devices in accordance with one example embodiment. System 10 includes a test analyzer 12 having a processor 14 and a memory element 16. Test analyzer 12 receives inputs from a variety of databases and software tools, including electronic design automation (EDA) tools 18, integrated circuit (IC) design database 20, design-for-test (DFT) and automatic test pattern generator (ATPG) database 22, static timing analysis (STA) and voltage (IR) simulation database 24, and quality metrics 26. The inputs from a variety of databases and software tools include specifications, design details, circuit schematics, simulation data, signal patterns, expected device behavior, and various other parameters associated with a specific semiconductor device-under-test (DUT) 28. For example, DUT 28 may comprise a mixed-signal integrated circuit with digital logic circuits; in another example, the specific semiconductor device may comprise a digital integrated circuit, such as a digital signal processor, a microprocessor, etc. Any suitable semiconductor device with at least one digital logic circuit thereon may be included in DUT 28 within the broad scope of the embodiments.

Test analyzer 16 may generate as output, an ordered test set 30 of scan patterns and test corners with thresholds that can be used to test DUT 28. Ordered test set 30 is fed to a test program 32, which is used to configure (e.g., program) a test instrument 34. Test instrument 34 comprises a processor 36, a memory element 38, one or more measurement tools 40, and a test head 42. During testing, a device interface board 44 is placed on test head 42. DUT 28, comprising a manufactured version thereof, is placed on device interface board 44 for testing. During probing, DUT 28 comprises a wafer of semiconductor chips (e.g., semiconductor devices). During final test (e.g., production testing), DUT 28 comprises separately packaged integrated circuits (e.g., semiconductor devices). Device interface board 44 is appropriately configured with suitable hardware components (e.g., relays, resistors, switches, capacitors, etc.) to enable interfacing with test head 42 for probing or final test. For example, a first device interface board 44 may be used for probing, the first device interface board 44 having appropriate probing needles to test pins on the wafer; a second device interface board 44 may be used for final test, the second device interface board 44 having appropriate sockets to test leads on the separate integrated chips.

During testing, test instrument 34, configured according to test program 32, tests DUT 28 according to test conditions of ordered test set 30. Test instrument 34 generates test data 46 from testing DUT 28. Test data 46 comprises test effectiveness data and silicon learning in some embodiments. Test data 46 is used to correlate with quality metrics 26 in some embodiments, and used as feedback to improve accuracy and effectiveness (among other parameters) of ordered test set 30 for effective transition fault testing of DUT 28.

For purposes of illustrating the techniques of system 10, it is important to understand the communications that may be traversing the system shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

Transition fault tests use scan patterns as test inputs. The scan patterns comprise voltage (or current) signals in time with particular clock cycles. The digital logic circuit's flip-flops are modified to allow them to function as stimulus and observation points, referred to as scan cells, during test. The scan cells are linked together into scan chains that operate as shift registers when the circuit is put into test mode. The scan chains are used by external test instruments to deliver scan patterns into the semiconductor device under test. After the scan pattern is loaded into the semiconductor device, the circuit is placed back into functional mode and the test response is captured in one or more clock cycles. The circuit is again put in test mode and the captured test response is shifted out, while the next scan pattern is simultaneously shifted into the scan cells. The test instrument compares the captured test response with an expected response data stored in its memory. Any mismatches are likely defects and are logged for further evaluation.

ATPG software is used to automatically create the scan patterns based on transition fault models (also called at-speed fault models) that predict the expected response of the digital logic circuit. The ATPG software uses the fault models to determine the particular scan patterns that can detect corresponding faults at fault sites in the circuit. The transition fault model uses scan patterns that create a transition stimulus to change a logic value from 0-to-1 or 1-to-0. The time allowed for the transition is specified, such that if the transition does not happen, or happens outside the allotted time, a timing defect is presumed.

Transition fault test is a dominant contributor to overall test cost of a semiconductor device. Transition fault tests are generally run at pre-package probe and after-package final test. Typically, transition fault tests are run at multiple supply voltage and temperature conditions at probing and final test. Each combination of supply voltage and temperature is referred to herein as a test corner. In a general sense, cost reduction can be achieved in several ways, for example, through suitable design changes of the digital circuit, optimization in ATPG scan patterns, or optimization in testing. Pre-silicon test optimization (i.e., optimizing before the semiconductor device is manufactured) is more desirable than post-silicon test optimization (i.e., optimizing after the semiconductor device is manufactured).

System 10 is configured to address such issues (among others) in determining test conditions for at-speed transition delay fault tests on semiconductor devices. According to various embodiments, test analyzer 12 analyzes existing transition scan patterns generated from ATPG. Test analyzer 12 extracts at-speed paths activated per scan pattern and examines the paths in STA to determine the worst case corner. Test analyzer 12 classifies the scan patterns and creates a histogram of test corners versus number of paths that exhibit worst-case behavior (e.g., maximum delays) at the test corners. Test analyzer 12 analyzes the histogram for trends (e.g., corner1 has most number of paths; corner20 has least number of paths, etc.). Test analyzer 12 orders the set of scan pattern-test corner combinations based on desired fault coverage, slacks and other quality and design metrics. In some embodiments, an enhanced algorithm executed at test analyzer 12 also considers second-order effects, such as switching activity (for IR and cross-talk) and n-detection criteria (e.g., a fault on a path is not considered to be detected until it is detected n times).

Test analyzer 12 chooses a threshold of the ordered scan pattern-test corner combination based on quality metrics 26. For example, quality metrics 26 can specify that fault coverage can be path delay; in another example, quality metrics 26 can specify that fault coverage can be transition fault; in yet another example, quality metrics 26 can specify a defective parts-per-million (DPPM) value, which is used to calculate the threshold.

The thresholds and the ordered scan pattern-test corner combination comprises ordered test set 30, which is used to test DUT 28 using test instrument 34. Test data 46 obtained from testing DUT 28 is correlated with simulation results. Any gaps are tagged and correlation feedback is provided to the pre-silicon process, for example, algorithms associated with calculating the threshold, and/or ordering the scan pattern-test corner combinations. For circuit designs that have not been actually tested (e.g., the circuit design has not yet been fabricated into an integrated chip), test data 46 can comprise data collected from ICs with similar (but not identical) circuit designs, or related products, or sample ICs (e.g., not from large-scale manufacturing processes), etc.

In some embodiments, test analyzer 12 creates new scan patterns such that the overall number of test corners for the entire scan pattern set is reduced. Validation for optimization purposes may also be performed. In some embodiments, test analyzer 12 leverages standard delay format, timing and delay information in advanced fault-model ATPG databases to improve effectiveness of ordered test set 30.

Turning to the infrastructure of system, system 10 can include any number of databases, computing devices, test instruments, and other nodes inter-connected to form a large and complex network. In particular, system 10 can comprise databases, computing devices, and test instruments distributed in various geographic locations that are communicatively coupled (e.g., over the Internet, local area network, or other suitable network). For example, databases 20-24 may be located in various different cloud networks spread across disparate geographic locations in the United States; EDA tools 18 may execute locally with test analyzer 12; test analyzer 12 may comprise a plurality of computing devices executing using distributed computing protocols in a local area network; quality metrics 26 may be stored at the same geographic location as test analyzer 12, and connected over a local area network; test instrument 34 may be located in a manufacturing location overseas, for example, in Malaysia; and so on.

In a general sense, the network connecting the various elements represents a series of points or nodes of interconnected communication paths for receiving and transmitting packets and/or frames of information that are delivered to the system. A node may be any electronic device, computer, printer, hard disk drive, client, server, peer, service, application, or other object capable of sending, receiving, or forwarding information over communications channels in a network. Elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs. The architecture of the present disclosure may also operate in conjunction with any suitable network protocol, where appropriate and based on particular needs. In addition, gateways, routers, switches, and any other suitable nodes (physical or virtual) may be used to facilitate electronic communication between various nodes in system 10.

Note that the numerical and letter designations assigned to the elements of FIG. 1 do not connote any type of hierarchy; the designations are arbitrary and have been used for purposes of teaching only. Such designations should not be construed in any way to limit their capabilities, functionalities, or applications in the potential environments that may benefit from the features of the system. It should be understood that the system shown in FIG. 1 is simplified for ease of illustration.

In particular embodiments, test analyzer 12 comprises any suitable computing device (e.g., server, desktop computer, laptop computer) configured with appropriate network interfaces, EDA interfaces and other suitable interfaces to communicate with the various elements interconnected thereto and receive data therefrom. In some embodiments, test analyzer 12 may be implemented in a specialized test instrument 34, rather than in a separate computing device. Test instrument 34 comprises any suitable equipment that can be configured as described herein to enable it to test DUT 28 in wafer or packaged form using test program 32 comprising ordered test set 30 of scan patterns and test corners with thresholds. For example, test instrument 34 may comprise an automated test equipment (ATE) used in semiconductor manufacturing facilities; in another example, test instrument 34 may comprise a characterization lab tester used in engineering laboratories to characterize and experiment on DUT 28.

In various embodiments, measurement tools 40 in test instrument 34 comprise specialized hardware including source and capture instruments, such as test controllers, arbitrary waveform generators (AWGs), digitizers, voltmeters, power supplies, parametric measurement units, digital multi-meters, multiplexers, analog-to-digital converters, digital-to-analog converters, clocks, electronic relays and switches, comparators, electrical clamps, and other electronic test equipment. Test instrument 34 can be configured suitably to measure a wide variety of circuits and electronic components, from resistors and capacitors to highly complex mixed-signal integrated circuits. In some embodiments, test instrument 34 includes a master controller (usually a computing device) that synchronizes one or more measurement tools 40. DUT 28 may be physically connected to test instrument 34 by a robotic machine (e.g., a Handler or Prober) and through a customized Interface Test Adapter (ITA) (e.g., fixture) such as a device interface board 42 that adapts test instrument 34's resources to DUT 28. Test instrument 34 may be configured with numerous Peripheral Component Interconnect Express (PCIe) slots for accommodating signal sensing cards communicating signals to and from DUT 28.

Figure 2:
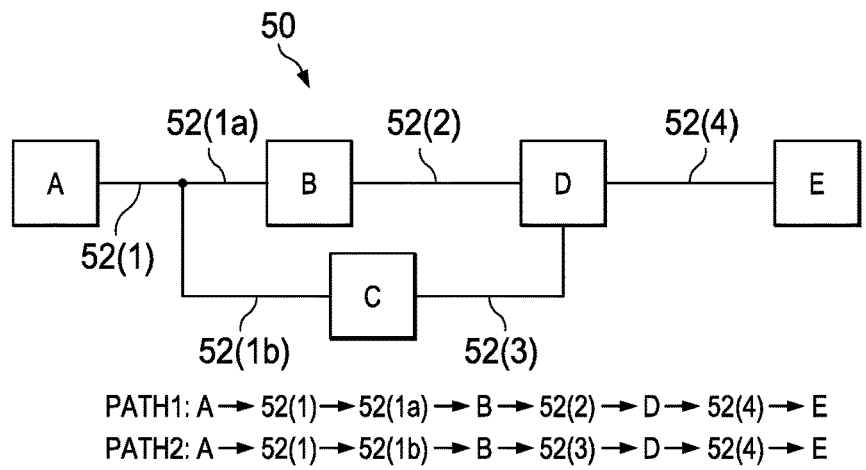
FIG. 2 is a simplified block diagram illustrating example details of embodiments of the system.

Turning to FIG. 2, FIG. 2 is a simplified block diagram illustrating an example circuit 50 of system 10. Circuit 50 comprises a portion of DUT 28. A represents an input/flip-flop, E represents an output/flip-flop; B, C and D represent Boolean gates (AND, NOR etc.). Interconnects 52(1), 52(1a), 52(1b), 52(2), 52(3), and 52(4) connect the various Boolean gates A, B, C, and D appropriately. Interconnect 52(1) divides into two interconnects 52(1a) and 52(1b), respectively connecting gate A to gates B and C. Interconnect 52(2) connects gates B and D; interconnect 52(3) connects gates C and D; and interconnect 52(4) connects gates D and E. Signals (e.g., current, voltage) from gate A to gate E may follow at least two different paths: Path1 is: A 452(1) 452(1a) 4B 452(3) 4D 452(5) 4E; Path2 is: A 452(1)-52(1b) 4C 452(4) 4D 452(5) 4E. According to various embodiments, test analyzer 12 can extract Path1 and Path2 from circuit design inputs of IC design database and netlist 20 and EDA tools 18. Test analyzer 12 can calculate delays in Path1 and Path2 for scan patterns provided by DFT and ATPG database 22 at different test corners.

In a general sense, a transition on a path (e.g., Path1) starts at an input flip-flop (e.g., A) and propagates to an output flip-flop (e.g., E). In the example provided, the transition may be propagated on Path1 or Path2 or both. Generally, every path in the circuit is expected to meet performance requirements. However, manufacturing processes of the integrated circuits produce delays, and also variations in delays between different integrated circuits having the same circuit design. For a circuit design performing at 500 MHz, the expected time for a transition to propagate is 2 ns. Any delay on any propagation path should be less than 2 ns; in other words, the maximum expected delay for the circuit is 2 ns.

Delays vary based on voltage and temperature, the so-called test corners. For example, in corner1, comprising voltage V1 and temperature T1, delay on Path1 is 1.5 ns and delay on Path2 is 1 ns. In other words, Path1 has a slack (e.g., maximum expected delay-actual delay) of 0.5 ns (e.g., 2 ns-1.5 ns) and Path2 has a slack of 1 ns in the {V1, T1} test corner. In a different corner2, comprising voltage V2 and temperature T2, slack for Path1 may be 0.3 ns and Path2 may be 1.8 ns. For purposes of explaining the various embodiments herein, the test corner with the least slack (e.g., most delay) is referred to as "worst-case corner" for that path. Note that "worst-case behavior" (of a path) refers to relatively low slacks, wherein as between a first path, Path1, having a first slack and a second path, Path2, having a second slack, the second path Path2 exhibits worst-case behavior if the second slack is lower than the first slack.

Turning back to the example presented, the worst-case corner for Path1 is corner2 {V2,T2}; the worst-case corner for Path2 is corner1 {V1, T1}. Conversely, for corner1 and corner 2, worst-case behavior is exhibited by Path1. For a delay defect of a path to be detected, it has to be larger than the slack on the path. Thus, in corner1, delay on Path1 has to be greater than 0.5 ns and on Path2 greater than 1 ns for the delay to be detected. In other words, any delays on Path1 greater than 0.5 ns gives rise to a detected fault during testing of DUT 28. Thus, for effective test coverage and detecting more defects, the right test corner having greater delays may be chosen (e.g., if the right corner is not chosen, higher defective parts per million (DPPM) can result).

Figure 3:
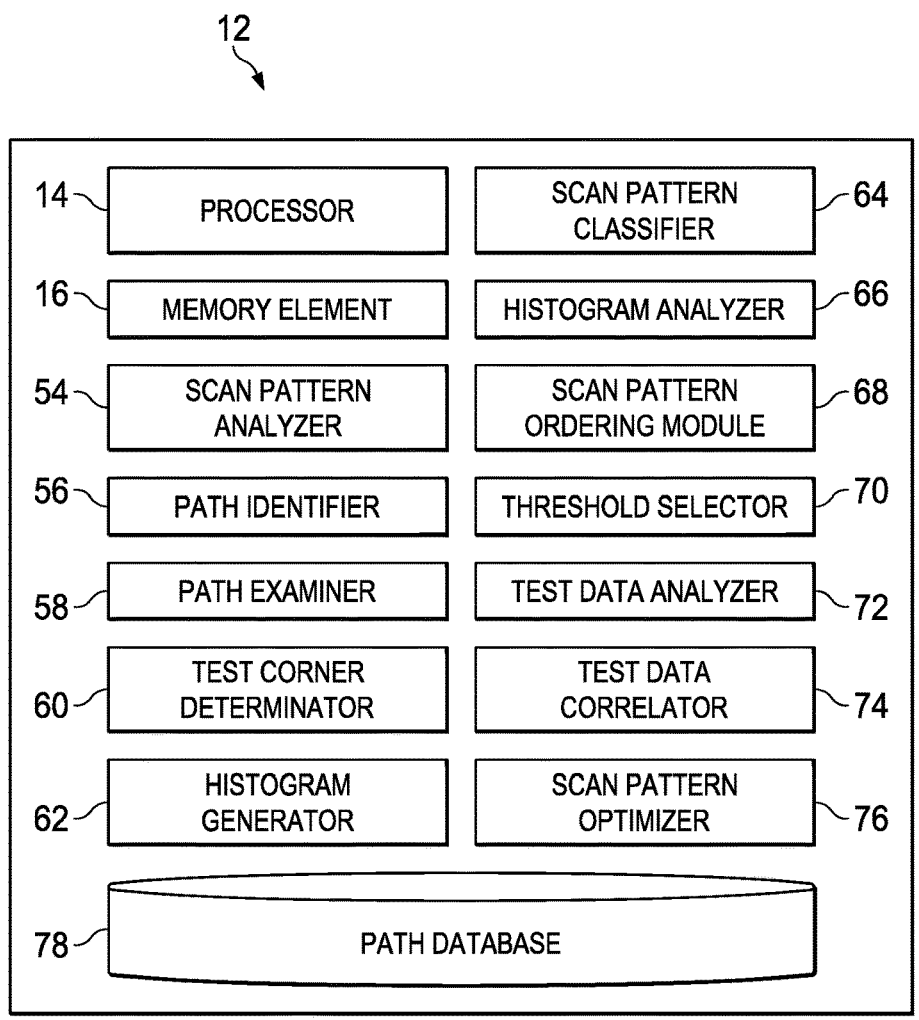
FIG. 3 is a simplified block diagram illustrating other example details of embodiments of the system.

Turning to FIG. 3, FIG. 3 is a simplified block diagram illustrating an example test analyzer 12 of system 10. Test analyzer 12 comprises, in addition to processor 14, and memory element 16, a scan pattern analyzer 54, a path identifier 56, a path examiner 58, a test corner determinator 60, a histogram generator 62, a scan pattern classifier 64, a histogram analyzer 66, a scan pattern ordering module 68, a threshold selector 70, a test data analyzer 72, a test data correlator 74, a scan pattern optimizer 76, and a path database 78. According to various embodiments, scan pattern analyzer 54 analyzes existing transition scan patterns generated from ATPG. Path identifier 56 identifies at-speed paths activated per scan pattern. The identified paths are stored in path database 78. Path examiner 58 examines the identified paths in STA and determines behavior of paths at different test corners. Test corner determinator 60 determines the worst case test corner for each path. For example, test corner determinator 60 identifies a worst-case test corner for each path; the worst-case test corner comprises one of the different test corners at which the path exhibits worst-case behavior (e.g., worst slack). Test corner determinator 60 determines a number of paths exhibiting worst-case behavior at each test corner for each scan pattern. Scan pattern classifier 64 classifies the scan patterns according to a histogram generated by histogram generator 62 for each scan pattern. The histogram comprises a representation of a distribution of paths exhibiting worst-case behavior at corresponding test corners.

Histogram generator 62 creates the histogram of test corners versus number of paths that exhibit worst-case behavior (e.g., maximum delays) at the test corners for the classified scan patterns. Histogram analyzer 66 analyzes the histogram for trends (e.g., corner1 has most number of paths; corner20 has least number of paths, etc.). Scan pattern ordering module 68 orders the scan pattern-test corner combinations according to the trend of the histogram, for example, based on desired fault coverage, slacks and other quality and design metrics. In some embodiments, an enhanced algorithm executed at test analyzer 12 also considers second-order effects, such as switching activity (for IR and cross-talk) and n-detection criteria (e.g., a fault on a path is not considered to be detected until it is detected n times).

Threshold selector 70 chooses a threshold of the ordered scan pattern-test corner combination based on quality metrics 26. For example, quality metrics 26 can specify that fault coverage can be path delay; in another example, quality metrics 26 can specify that fault coverage can be transition fault; in yet another example, quality metrics 26 can specify a defective parts per million (DPPM) value, which is used to calculate the threshold. The ordered scan pattern-test corner combinations above the threshold are associated with higher defect levels and the ordered scan pattern-test corner combinations below the threshold are associated with lower defect levels. The thresholds and the ordered scan pattern-test corner combinations comprises ordered test set 30, which is used to test DUT 28 using test instrument 34.

Test data analyzer 72 analyzes test data 46 obtained from testing DUT 28 using ordered test set 30. Test data correlator 74 correlates test data 46 with simulation results (e.g., expected data). Any gaps are tagged and correlation feedback is provided to various components of test analyzer 12, for example, threshold selector 70, path identifier 56, and/or scan pattern ordering module 68. In some embodiments, test data 46 is correlated with quality metrics 26. In some embodiments, scan pattern optimizer 76 creates new scan patterns such that the overall number of test corners for the entire scan pattern set is reduced. Validation for optimization purposes may also be performed. In some embodiments, scan pattern optimizer 76 leverages standard delay format, timing and delay information in advanced fault-model ATPG databases to improve effectiveness of ordered test set 30.

Figure 4:
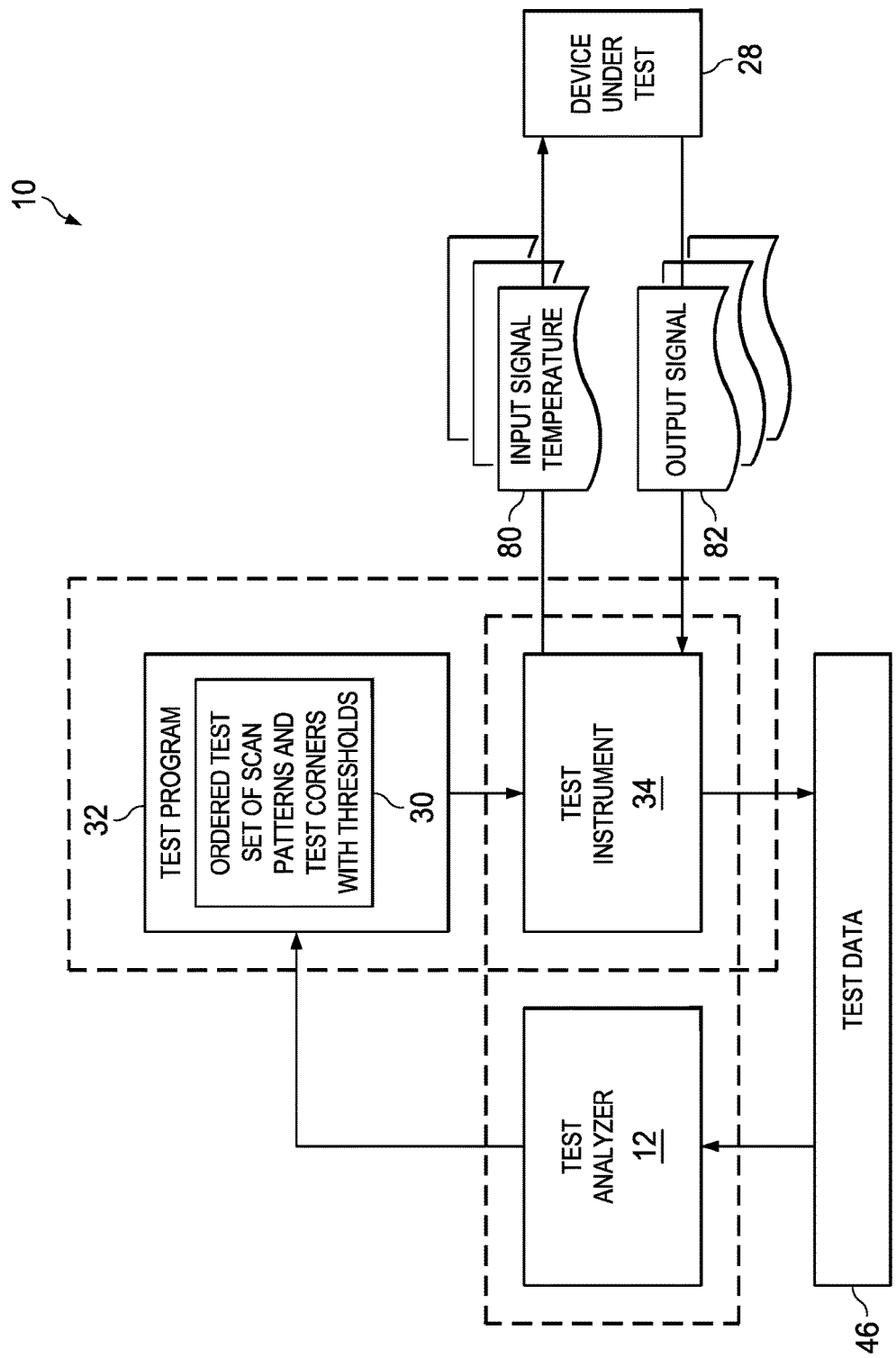
FIG. 4 is a simplified block diagram illustrating yet other example details of embodiments of the system.

Turning to FIG. 4, FIG. 4 is a simplified block diagram illustrating an example embodiment of system 10. Test analyzer 12 provides test program 32 with ordered test set 30 of scan patterns and test corners with thresholds. Test program 32 may include various other tests that are beyond the scope of the description herein. Test instrument 34 executes test program 32, generating input signals and temperature conditions 80 for testing DUT 28. DUT 28 may be placed in an oven or other suitable equipment whose temperature can be controlled according to input signals and temperature conditions 80. The input signals can comprise voltage and/or current signals, including scan patterns, voltage settings of various pins of DUT 28, etc. DUT 28 may respond to input signals and temperature conditions 80 with output signals 82. Test instrument 34 may convert output signals 82 into test data 46 suitably. For example, output signals 82 may comprise voltage signals; test instrument 34 may convert the voltage signals into ASCII text format with the voltage values according to the voltage signals. Output signals 82 may indicate path delay, transition fault delays, and other defects in DUT 28.

In some embodiments, test analyzer 12 may be co-located with test instrument 34 in a single equipment. Such specially configured test equipment may generate scan patterns and thresholds in-situ, for example, during initial characterization of DUT 28 before large scale manufacturing. The specially configured test equipment comprising test analyzer 12 and test instrument 34 may interface with various design databases and EDA tools and generate scan patterns at various test corners and select thresholds based on testing of DUT 28 and test data 46.

In some embodiments, test instrument 34 may be configured specially according to test program 32. For example, only those measurement tools 40 that are required according to test program 32 are activated in test instrument 34. Other measurement tools that are not needed by test program 32 are inactivated or removed from test instrument 34.

Figure 5:
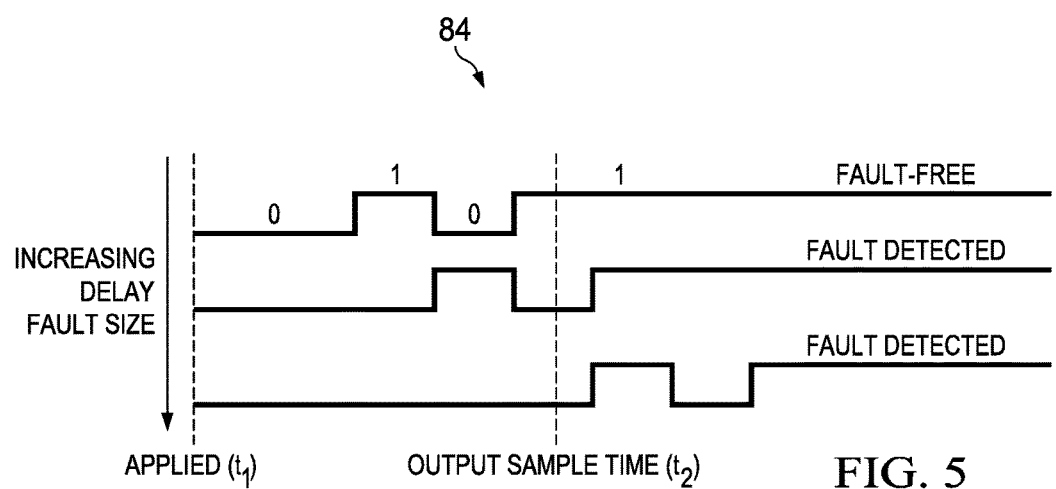
FIG. 5 is a simplified block diagram illustrating yet other example details of embodiments of the system.

Turning to FIG. 5, FIG. 5 is a simplified diagram illustrating example details of an embodiment of system 10. A transition fault pattern applies voltage (and/or current signals) to DUT 28 to create transitions on paths, clocks the flip-flops and observes expected values on flip-flops. For example, a specific scan pattern (e.g., 11101000) is input at time t1 to DUT 28. The logic values represent voltage or current signals (e.g., a logic value of 1 represents a relatively high voltage; a logic value of 0 represents a relatively low voltage). Output signal 84 may be observed and a sample captured at time $t_2$. An expected value of 1 indicates a fault free state; a value of 0 indicates a detected fault. Any transition fault causes a gate input or output to be slow to transition, resulting in the unexpected reading at sample time $t_2$. In a general sense, one of the goals of the transition fault pattern set is to activate as many transition faults as possible to increase fault coverage and reduce DPPM.

Figure 6:
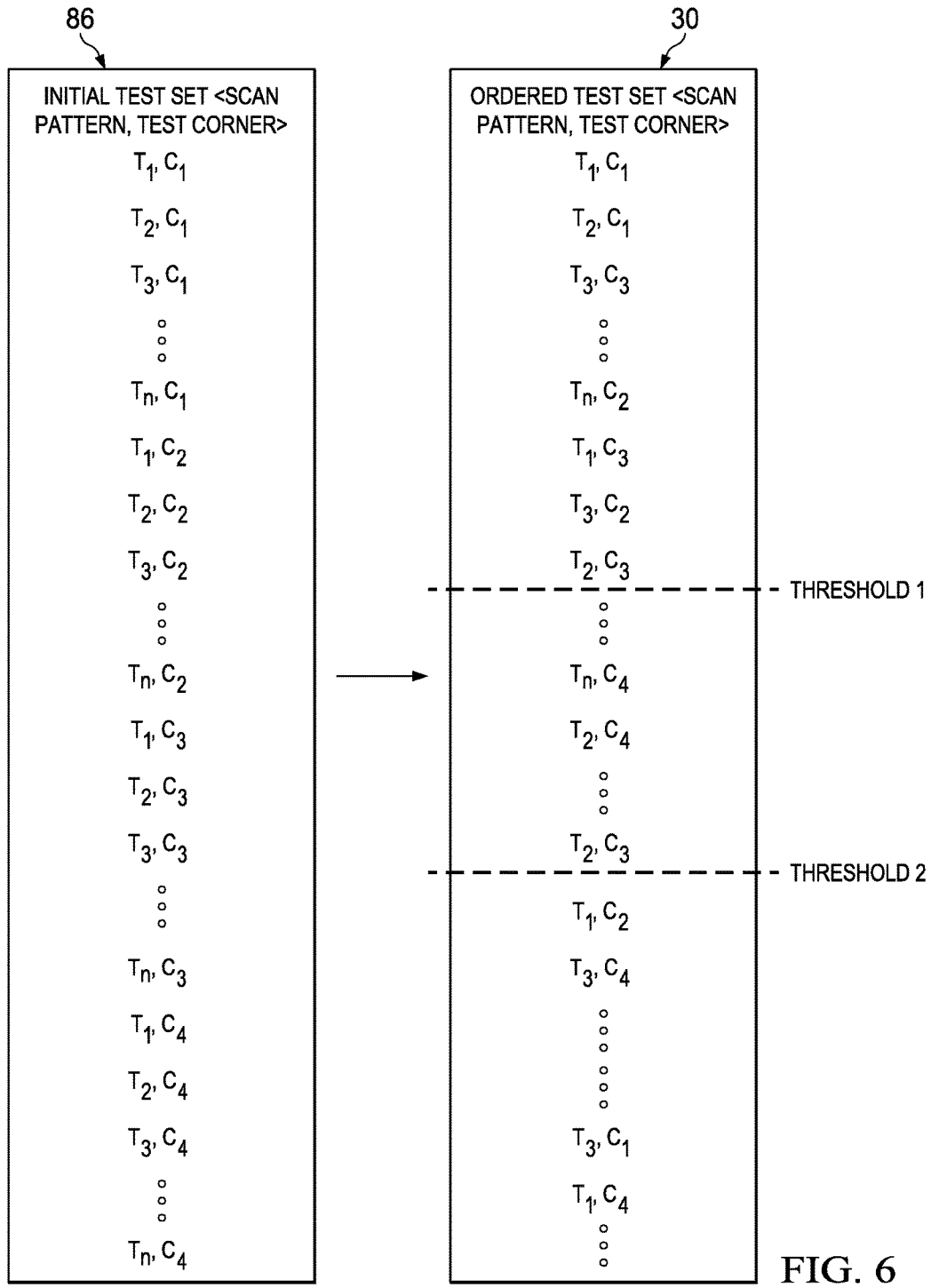
FIG. 6 is a simplified block diagram illustrating yet other example details of embodiments of the system.

Turning to FIG. 6, FIG. 6 is a simplified diagram illustrating example details of an embodiment of system 10. Test analyzer 12 receives as input an initial test set 86 comprising a plurality of scan patterns $T_1, T_2, \ldots T_n$, and test corners (e.g., combination of supply voltage and temperature) at which DUT 28 is to be tested. In general, the plurality of scan patterns $T_1, T_2, \ldots T_n$, may be tested at a plurality of test corners $C_1, C_2, \ldots C_m$. The test corners can vary with the specific circuit design of DUT 28; for example, a first DUT 28 may be tested using 1.6V at 125° C. (corner1), 1.6V at 25° C. (corner2), and 1.6V at −40° C. (corner3); another DUT 28 may be tested using 2V at 125° C. (corner1), 1.6V at 150° C. (corner2), 2V at 25° C. (corner3), 2V at −25° C. (corner4) and 1.6V at −40° C. (corner5); and so on. The example presented in the figure shows four test corners, $C_1$, $C_2$, $C_3$ and $C_4$.

According to various embodiments, test analyzer 12 analyzes the circuit for the plurality of scan patterns $T_1, T_2, \ldots T_n$ and identifies the worst-case response for each test corner. Test analyzer 12 orders initial test set 86 according to ordering criteria (e.g., transition fault delays) and generates an ordered scan pattern and test corner combination. Test analyzer 12 further selects thresholds of the ordering criteria based on quality metrics, such as DPPM levels, to generate ordered test set 30 of scan patterns and test corners with thresholds. For example, scan pattern-test corner combinations listed above the DPPM threshold detect faults at defect levels above the DPPM threshold; scan pattern-test corner combinations listed below the DPPM threshold detect faults at defect levels below the DPPM threshold; therefore, only those scan pattern-test corner combinations listed above the DPPM threshold need to be run on DUT 28. The remaining scan pattern-test corner combinations can be ignored safely without affecting fault coverage. Thus, test time reduction can be achieved with minimal quality impact using pre-silicon data.

Turning to FIG. 7, FIG. 7 is a simplified diagram illustrating example details of an embodiment of system 10. In some embodiments, the threshold may comprise a window, including a range of values, rather than a specific, single, value. Pre-silicon threshold setting can be based on fault coverage and STA data in some embodiments. Test data 46 can be used to adjust previously selected threshold levels and threshold windows. In some embodiments, test data 46 comprises data obtained for devices in the same family of circuit design (e.g., derivatives of a particular IC; etc.). In some embodiments, the threshold (either value or window) is selected as close to the top as possible while maintaining a desired DPPM level.

Turning to FIG. 8, FIG. 8 is a simplified diagram illustrating example details of an embodiment of system 10. In some embodiments, second-order effects may be considered in selecting the thresholds for ordered list 30. Threshold 1 is selected based on pre-silicon STA and ATPG analysis for path coverage. For example, threshold 1 may comprise a window of DPPM values within a specific confidence interval of a particular DPPM value (e.g., DPPM ±3σ). The threshold selection is configured for transition fault coverage instead of (or in addition to) path coverage in some embodiments. Threshold selection can also be configured to use DPPM estimates, rather than delay values. Any suitable quality metrics 26 may be used for threshold selection according to the broad scope of the embodiments.

In some embodiments, second-order coverage metrics can be used for both ordering and threshold selection. For example, without limitation, threshold 2 may be selected based on IR effects (e.g., from IR and simulation tools); threshold 3 may be selected based on n-detect criteria. In some embodiments, a human operator (operating test instrument 34) may make a final selection as to one of the various thresholds initially selected by test analyzer 12 (e.g., run test program 32 choosing threshold 3 as criteria for yield; etc.). Other second-order metrics include crosstalk effects, switching effects, etc. Both ordering and threshold selection can also employ SDF (delay and timing information) available in ATPG. Algorithms can be modified to support groups of scan patterns rather than a single scan pattern; many production test programs group multiple scan patterns into one test.

Figure 9:
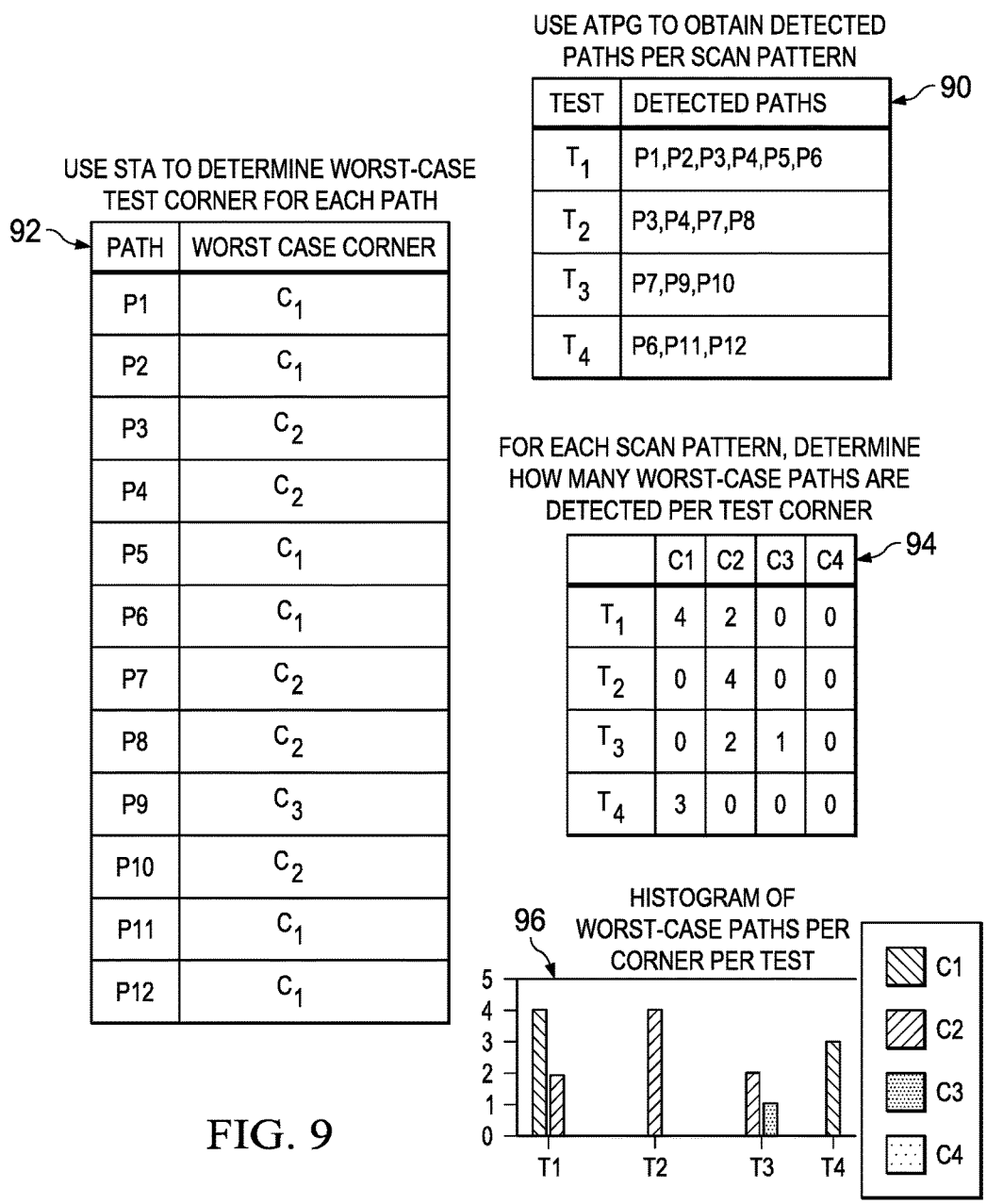
FIG. 9 is a simplified block diagram illustrating yet other example details of embodiments of the system.

Turning to FIG. 9, FIG. 9 is a simplified diagram illustrating example details of an embodiment of system 10. Test analyzer 12 analyzes scan patterns obtained from ATPG tools and detects paths through which the scan patterns propagate in DUT 28. An association (e.g., table) 90 is generated between the scan patterns and the detected paths. For example, test analyzer 12 detects that scan pattern $T_1$ propagates through paths P1, P2, P3, P4, P5 and P6 in DUT 28; scan pattern T2 propagates through paths P3, P4, P7 and P8; and so on. The paths depend on the specific circuit layout of DUT 28, including the various circuit elements and their interconnections. Association 90 may be stored in test analyzer 12 suitably, for example, in the form of a table, set, database entry, etc.

Test analyzer 12 uses STA to determine the worst case test corner for each detected path and stores an association 92 between the path and the corresponding worst-case test corner. The worst-case test corner comprises the combination of voltage and temperature that generates the longest delay on that path. For example, test analyzer 12 determines that test corner $C_1$ is the worst-case test corner for paths P1 and P2; test corner $C_2$ is the worst-case test corner for paths P3 and P4; and so on. The worst-case test corners depend on the specific circuit layout of DUT 28, including the various circuit elements and their interconnections. Association 92 may be stored in test analyzer 12 suitably, for example, in the form of a table, set, database entry, etc.

Test analyzer 12 determines how many worst-case paths are detected per test corner for each scan pattern. For example, scan pattern $T_1$ is propagated through paths P1, P2, P3, P4, P5 and P6, of which P1, P2, P5 and P6 have $C_1$ as the worst-case test corner; thus, scan pattern $T_1$ is associated with 4 worst-case paths at test corner $C_1$. Similar analyses are performed for each scan pattern and test corner, and an association 94 thereof is stored in a suitable format in test analyzer 12. Association 92 may be stored in test analyzer 12 suitably, for example, in the form of a table, set, database entry, etc. A histogram 96 of worst-case paths per test corner per scan pattern may also be generated in some embodiments.

Figure 10:
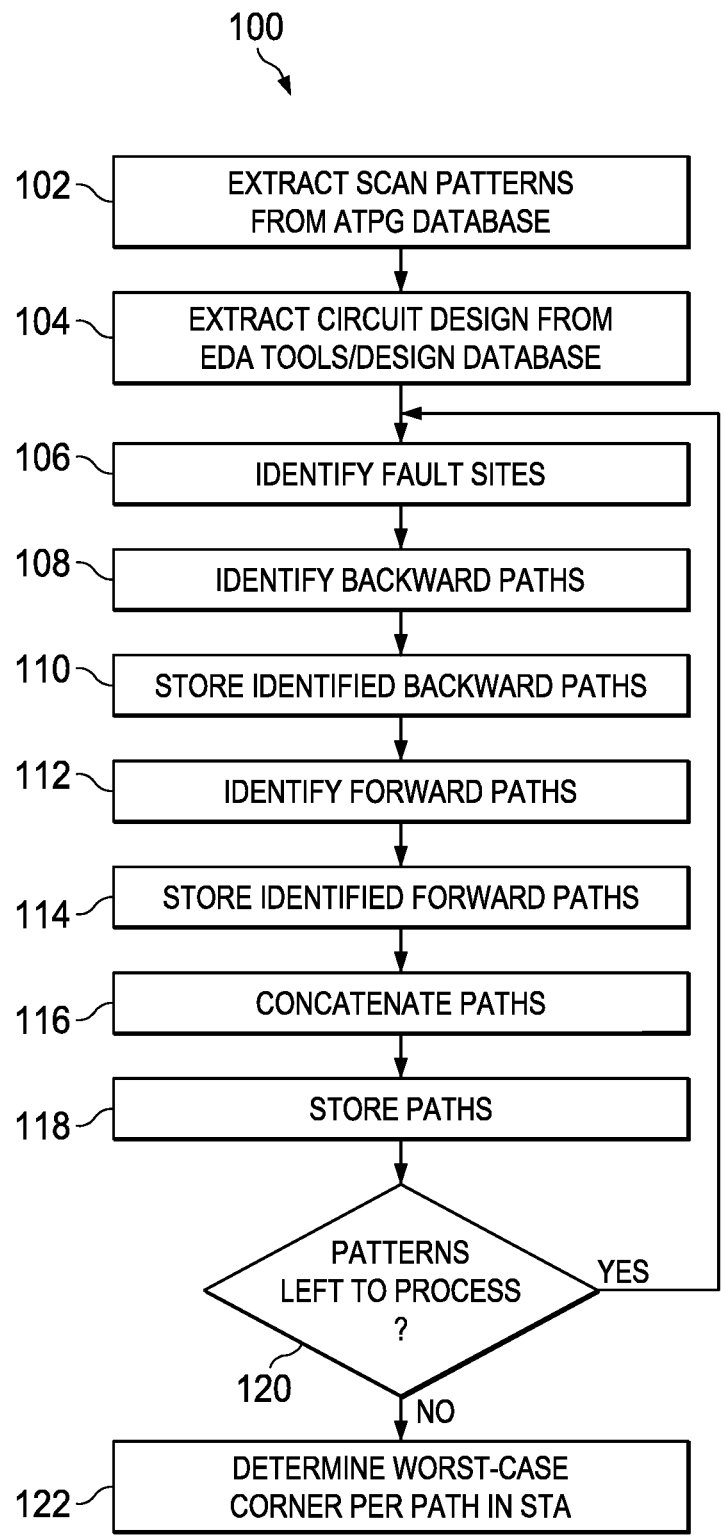
FIG. 10 is a simplified flow diagram illustrating example operations that may be associated with an embodiment of the system.

Turning to FIG. 10, FIG. 10 is a simplified flow diagram illustrating example operations 100 that may be associated with embodiments of system 10. At 102, ATPG scan patterns are extracted from DFT and ATPG database 22. At 104, the circuit design of DUT 28 is extracted from IC Design Database and Netlist 20 and EDA tools 18. At 106, fault sites in the circuit are identified. At 108, paths activated by the extracted scan patterns are traced backward to the starting point (of each path) to identify the backward paths. At 110, the identified backward paths are stored in path database 78. At 112, paths activated by the extracted scan patterns are traced forward to the end point (of each path) to identify forward paths. At 114, the identified forward paths are stored in path database 78. At 116, the backward paths and the forward paths are concatenated. At 118, the concatenated paths for the corresponding scan patterns are stored in path database 78. Note that operations 106 to 118 are repeated for each scan pattern extracted at 102. At 120, a determination is made if additional scan patterns are to be processed. If so, the operations revert to 106; if no additional scan patterns are to be processed, at 122, the worst-case test corner for each path is determined in STA.

Figure 11:
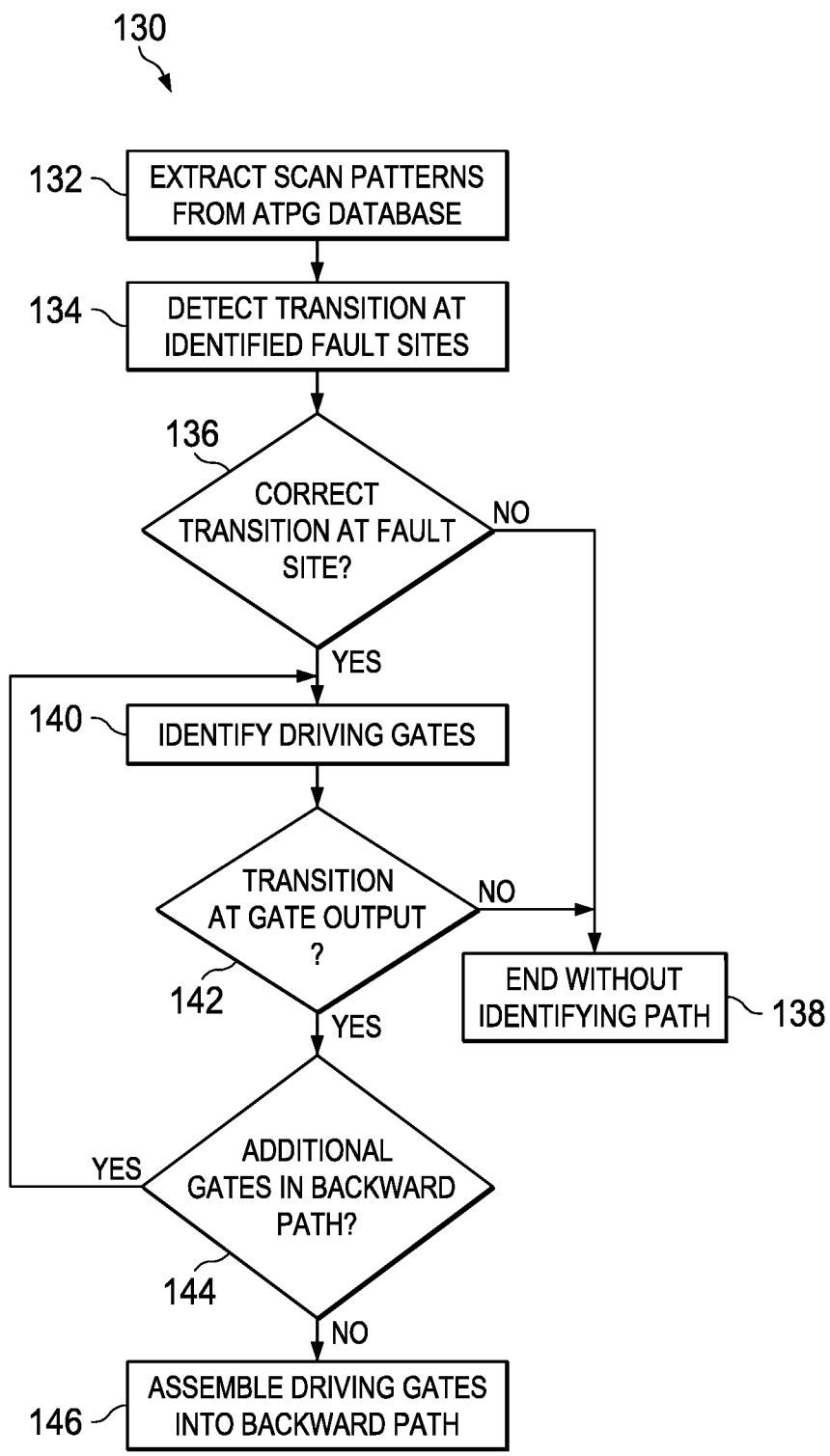
FIG. 11 is a simplified flow diagram illustrating other example operations that may be associated with an embodiment of the system

Turning to FIG. 11, FIG. 11 is a simplified flow diagram illustrating example operations 130 that may be associated with embodiments of system 10. Operations 130 may be associated with identifying backward paths for each identified fault in DUT 28. At 132, scan patterns are extracted from DFT and ATPG database 22. At 134, test analyzer 12 detects a transition at identified fault sites. A transition indicates signal switching from one value (e.g., low voltage indicative of a binary value such as 0) to another value (e.g., high voltage indicative of a binary value such as 1) at a semiconductor gate. At 136, a determination is made whether the detected transition is correct (e.g., signal switching is according to expected behavior). If not, the operations end at 138 without identifying any paths. If the transition is correct, at 140, the driving gate (e.g., driving the transition) is identified. At 142, a determination is made whether the transition occurs at the identified gate's output. If not, the operations end at 138. If the transition occurs at the identified gate's output, at 144, a determination is made whether additional gates are to be studied. If additional gates are to be studied, the operations revert to 140, and continue thereafter. If all relevant gates have been identified and analyzed, the identified gates are assembled into a backward path at 146. Thus, the backward path comprises the identified driving gates having the correct transitions according to the previous operations; in other words, the backward path is identified by the set of driving gates comprising it. The identified backward path is stored in path database 38.

Figure 12:
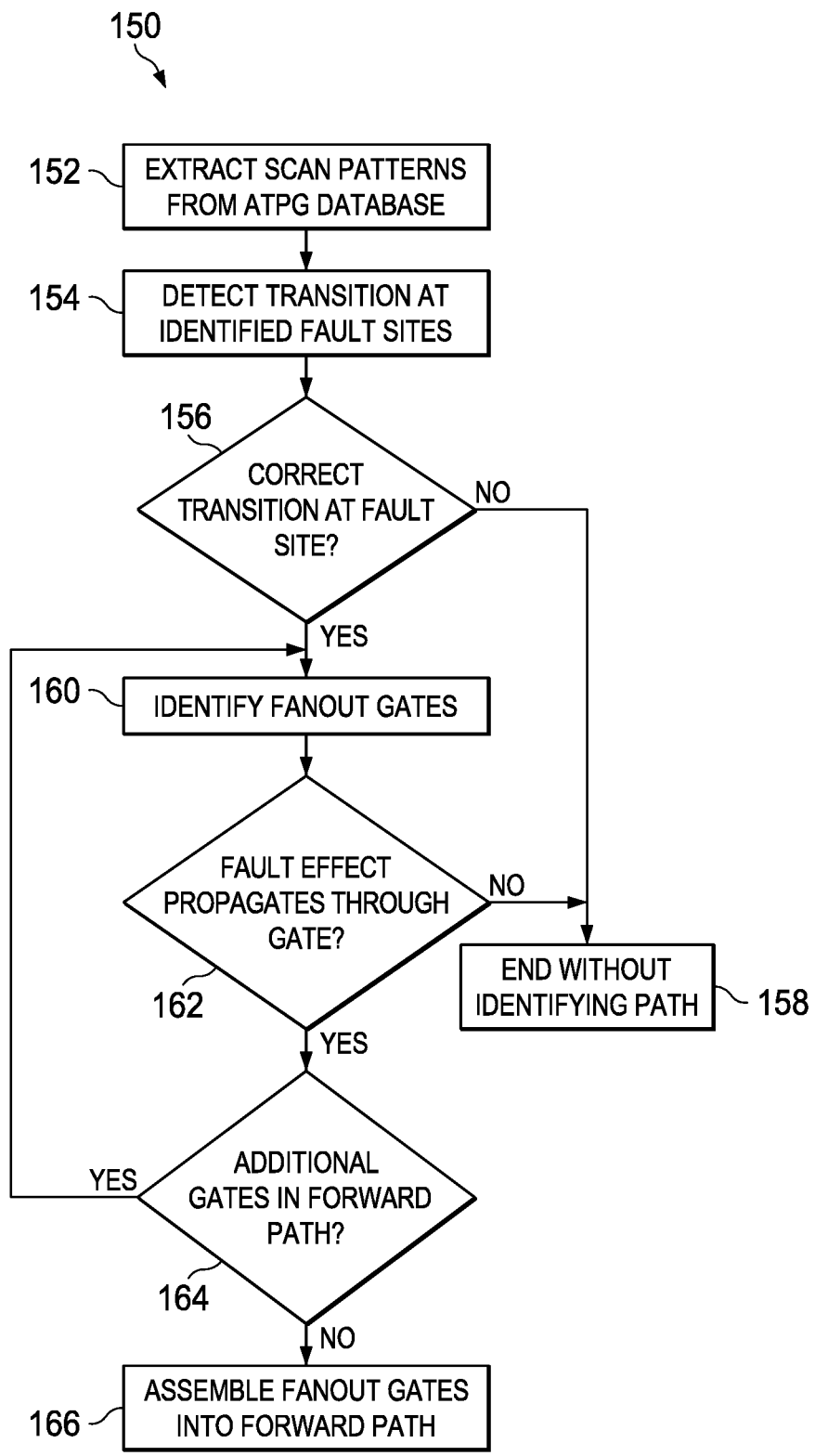
FIG. 12 is a simplified flow diagram illustrating yet other example operations that may be associated with an embodiment of the system.

Turning to FIG. 12, FIG. 12 is a simplified flow diagram illustrating example operations 150 that may be associated with embodiments of system 10. Operations 150 may be associated with identifying forward paths for each identified fault in DUT 28. At 152, scan patterns are extracted from DFT and ATPG database 22. At 154, test analyzer 12 detects a transition at identified fault sites. At 156, a determination is made whether the detected transition is correct (e.g., signal switching is according to expected behavior). If not, the operations end at 158 without identifying any paths. If the transition is correct, at 160, the fanout gate (e.g., receiving the transition as input) is identified. At 162, a determination is made whether the fault effect propagates through the identified gate. If not, the operations end at 158. If the transition propagates through the identified gate, at 164, a determination is made whether additional gates are to be studied. If additional gates are to be studied, the operations revert to 160, and continue thereafter. If all relevant gates have been identified and analyzed, the identified fanout gates are assembled into a forward path at 166. Thus, the forward path comprises the identified fanout gates having the correct transitions according to the previous operations; in other words, the forward path is identified by the set of fanout gates comprising it. The identified forward path is stored in path database 38.

Figure 13:
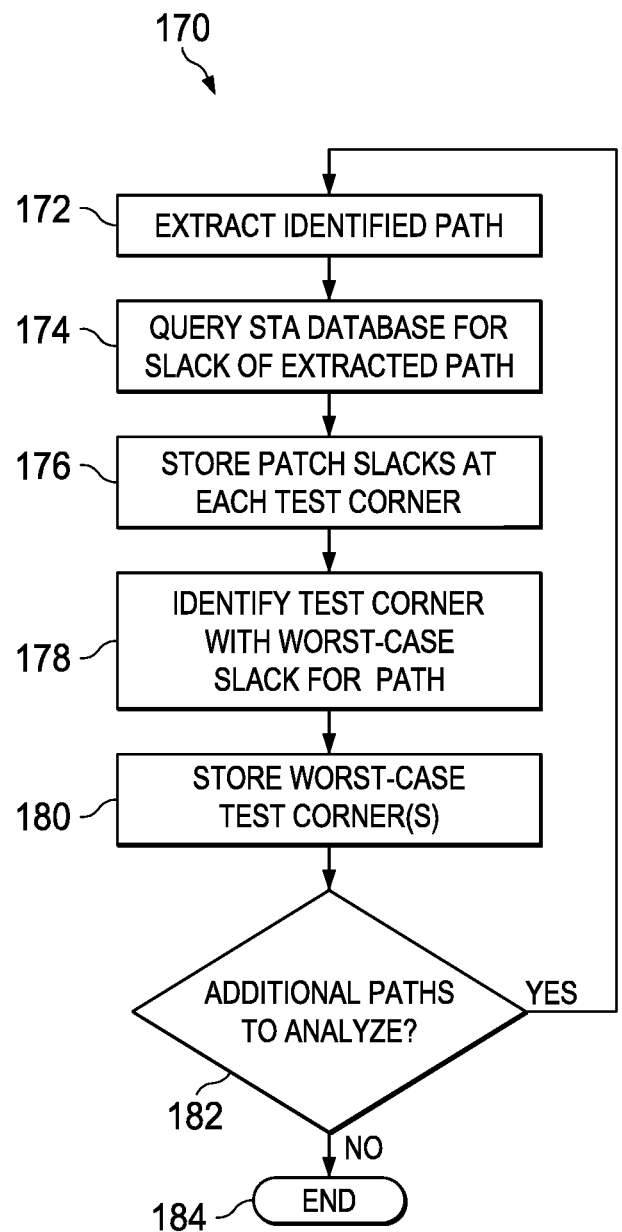
FIG. 13 is a simplified flow diagram illustrating yet other example operations that may be associated with an embodiment of the system.

Turning to FIG. 13, FIG. 13 is a simplified flow diagram illustrating example operations 170 that may be associated with embodiments of system 10. At 172, one identified path is extracted from path database 78 by path examiner 58 of test analyzer 12. At 174, path examiner 58 queries STA, IR, simulation database 24 for slack (e.g., allowable delay-actual delay) of the extracted path at each test corner (e.g., combination of voltage and temperature). At 176, path examiner 58 stores the returned slacks at each test corner in a suitable storage array, for example, in memory element 16. At 178, test corner determinator 60 of test analyzer 12 identifies the test corner with the worst-case slack (e.g., smallest slack value) for the extracted path. At 180, the identified worst-case test corner is stored in a suitable storage array, for example, in memory element 16. At 182, a determination is made whether additional paths are to be analyzed. If so, the operations revert to 172, and continue thereafter. If all paths stored in path database 78 have been analyzed, at 184, the operations end.

Figure 14:
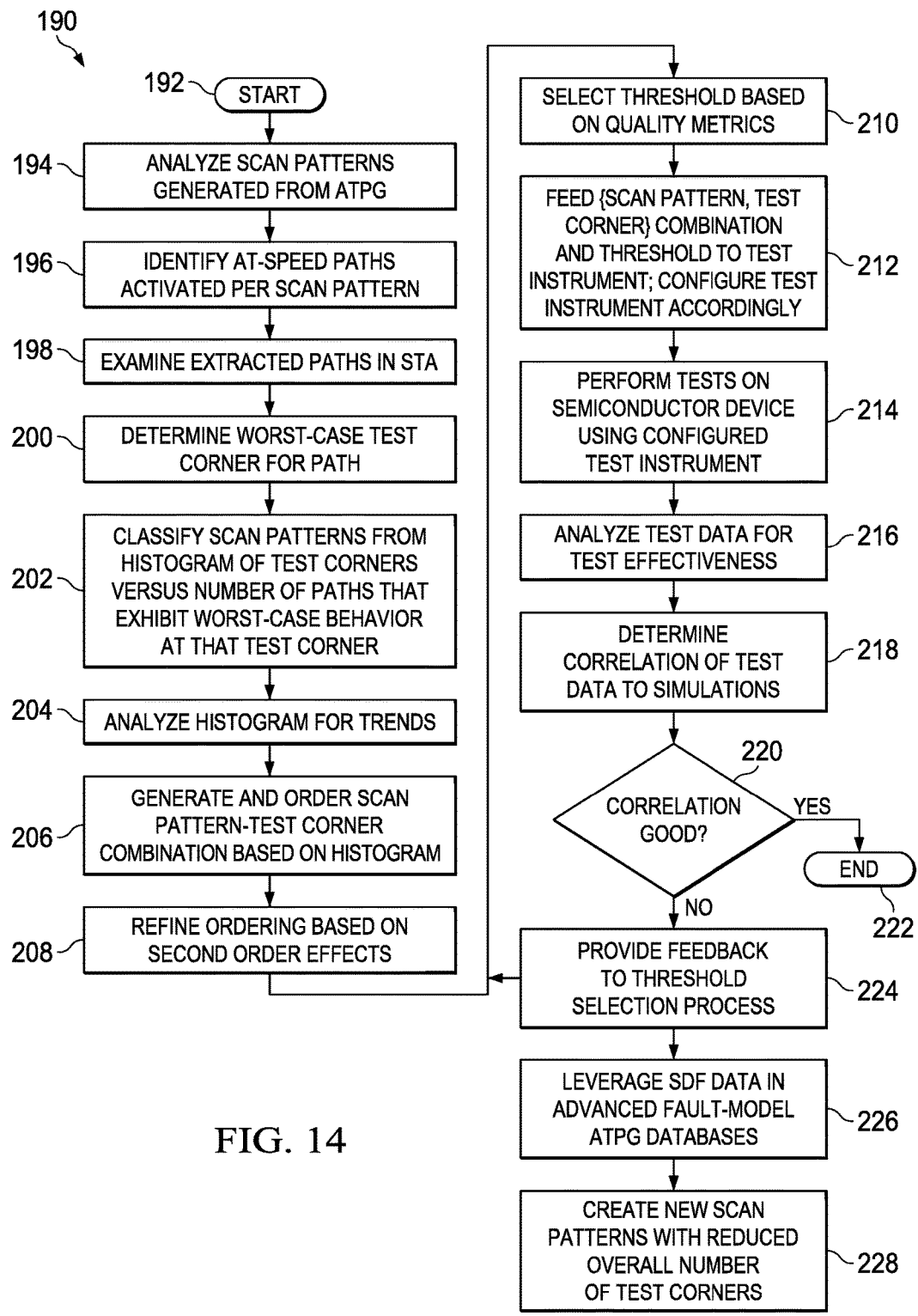
FIG. 14 is a simplified flow diagram illustrating yet other example operations that may be associated with an embodiment of the system.

Turning to FIG. 14, FIG. 14 is a simplified flow diagram illustrating example operations 190 that may be associated with embodiments of system 10. The operations start at 192, for example, with initializing of test analyzer 12. At 194, scan pattern analyzer 54 analyzes existing transition scan patterns generated from ATPG. In some embodiments, the scan patterns may be stored in DFT and ATPG database 22, and extracted therefrom for analysis. At 196, path identifier 56 identifies at-speed paths activated per scan pattern and stores the identified paths in path database 78. At 198, path examiner 58 examines the identified paths in STA. At 200, test corner determinator 60 determines the worst case test corner for each identified path. At 202, scan pattern classifier 64 classifies the scan patterns from a histogram of test corners versus number of paths that exhibit worst-case behavior (e.g., worst-case slack; maximum delays) at that test corner. In many embodiments, histogram generator 62 creates the histogram.

At 204, histogram analyzer 66 analyzes the histogram for trends (e.g., corner1 has most number of paths; corner20 has least number of paths, etc.). At 206, scan pattern ordering module 68 generates and orders the scan pattern-test corner combinations based on the histogram. For example, the ordering may be based on the trends according to desired fault coverage, slacks and other quality and design metrics. At 208, the ordering is refined based on second-order effects, such as switching activity (for IR and cross-talk) and n-detection criteria (e.g., a fault on a path is not considered to be detected until it is detected n times). At 210, threshold selector 70 chooses a threshold of the ordered scan pattern-test corner combination based on quality metrics 26. For example, quality metrics 26 can specify that fault coverage can be path delay; in another example, quality metrics 26 can specify that fault coverage can be transition fault; in yet another example, quality metrics 26 can specify a DPPM value, which is used to calculate the threshold. The thresholds and the ordered scan pattern-test corner combination comprises ordered test set 30, which is used to test DUT 28 using test instrument 34.

At 212, ordered test set 30 comprising the set of ordered scan pattern-test corner combinations with threshold is fed to test instrument 34; test instrument 34 is configured accordingly. At 214, configured test instrument 34 performs tests on DUT 28 according to test program 32, including ordered test set 30. At 216, test data analyzer 72 analyzes test data 46 obtained from testing DUT 28 using ordered test set 30. For example, the analysis may focus on test effectiveness (e.g., high fault coverage). At 218, test data correlator 74 correlates test data 46 with simulation results (e.g., expected data). At 220, a determination is made whether the correlation is good (e.g., as expected, with little to no deviation, or with deviations within measurement errors). In some embodiments, test data 46 is correlated with quality metrics 26. If the correlation is good, the operations end at 222.

Otherwise, at 224, any gaps are tagged and correlation feedback is provided to various components of test analyzer 12, for example, threshold selector 70, path identifier 56, and/or scan pattern ordering module 68. In some embodiments, validation for optimization purposes may also be performed. At 226, scan pattern optimizer 76 leverages standard delay format (SDF), timing and delay information in advanced fault-model ATPG databases to improve effectiveness of ordered test set 30. At 228, scan pattern optimizer 76 creates new scan patterns with reduced overall number of test corners for the scan pattern set. Thus, DUT 28 is tested only at the reduced number of test corners without sacrificing fault coverage, thereby reducing overall test costs.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Furthermore, the words "optimize," "optimization," and related terms are terms of art that refer to improvements in speed and/or efficiency of a specified outcome and do not purport to indicate that a process for achieving the specified outcome has achieved, or is capable of achieving, an "optimal" or perfectly speedy/perfectly efficient state.

In example implementations, at least some portions of the activities outlined herein may be implemented in software. In some embodiments, one or more of these features may be implemented in hardware, provided external to these elements, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Furthermore, the databases and associated computing devices described and shown herein (and/or their associated structures) may also include suitable interfaces for receiving, transmitting, and/or otherwise communicating data or information in a network environment. Test analyzer 12 described herein may be provisioned on servers comprising a plurality of memory elements and processors. Additionally, some of the processors and memory elements associated with the various nodes may be removed, or otherwise consolidated such that a single processor and a single memory element are responsible for certain activities. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory element 16) can store data used for the operations described herein. This includes the memory element being able to store instructions (e.g., software, logic, code, etc.) in non-transitory media, such that the instructions are executed to carry out the activities described in this Specification. A processor (e.g., processor 14) can execute any type of instructions associated with the data to achieve the operations detailed herein in this Specification. In one example, processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. The information being tracked, sent, received, or stored in the system could be provided in any database, register, table, cache, queue, control list, or storage structure, based on particular needs and implementations, all of which could be referenced in any suitable timeframe. Any of the memory items discussed herein should be construed as being encompassed within the broad term 'memory element.' Similarly, any of the potential processing elements, modules, and machines described in this Specification should be construed as being encompassed within the broad term 'processor.'

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to particular communication exchanges involving certain network access and protocols, the system may be applicable to other exchanges or routing protocols. Moreover, although the system has been illustrated with reference to particular elements and operations that facilitate the communication process, these elements, and operations may be replaced by any suitable architecture or process that achieves the intended functionality of the system.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method comprising:
   analyzing scan patterns for testing a circuit of a device under test;
   identifying paths in the circuit that are activated by the scan patterns;
   determining behavior of the paths at different test corners;
   generating a histogram for each scan pattern, the histogram comprising a representation of a distribution of paths exhibiting worst-case behavior at corresponding test corners;
   generating an ordered set of scan pattern-test corner combinations based on the histogram;
   selecting a threshold for the ordered scan pattern-test corner combinations based on quality metrics, wherein the ordered scan pattern-test corner combinations above the threshold are associated with higher defect levels and the ordered scan pattern-test corner combinations below the threshold are associated with lower defect levels;
   generating an ordered test set comprising the ordered scan pattern-test corner combinations with the selected threshold; and
   feeding the ordered test set to a test instrument, wherein the test instrument tests the device under test according to the ordered test set, wherein the tests are performed at the test corners listed above the selected threshold using the corresponding scan patterns of the scan pattern-test corner combinations.

2. The method of claim 1, wherein generating the histogram comprises:
   identifying a worst-case test corner for each path, wherein the worst-case test corner comprises one of the different test corners at which the path exhibits worst-case behavior; and
   determining a number of paths exhibiting worst-case behavior at each test corner for each scan pattern.

3. The method of claim 1, further comprising analyzing the histogram for trends, wherein the scan pattern-test corner combinations are generated and ordered according to the trend.

4. The method of claim 1, wherein the quality metrics for selecting the threshold comprises defective parts per million (DPPM) values.

5. The method of claim 1, further comprising refining the ordering of the scan pattern-test corner combinations based on second-order effects.

6. The method of claim 1, wherein determining behavior of the paths at different test corners comprises querying a static timing analysis database for slacks of the respective paths, wherein the behavior comprises the slacks.

7. The method of claim 1, wherein determining behavior of the paths at different test corners comprises performing static timing analysis to calculate the slacks of the respective paths, wherein the behavior comprises the calculated slacks.

8. The method of claim 1, wherein worst-case behavior comprises relatively low slacks, wherein as between a first path having a first slack and a second path having a second slack, the second path exhibits worst-case behavior if the second slack is lower than the first slack.

9. The method of claim 1, further comprising:
   receiving test data from the test instrument, wherein the test data comprises results of the tests on the device under test according to the ordered test set;
   analyzing the test data;
   correlating the test data to simulations; and
   refining the threshold selection based on the test data.

10. The method of claim 9, further comprising creating new scan patterns with reduced overall number of test corners.

11. The method of claim 1, wherein identifying the paths comprises:
   extracting the scan patterns from an automatic test program generator (ATPG) data base;
   extracting the circuit's design from at least electronic design automation tools;
   identifying fault sites in the design;
   for each scan pattern and each fault site, identifying backward paths, comprising paths activated by the scan pattern from the identified fault site to starting points of the corresponding paths;

for each scan pattern and each fault site, identifying
forward paths, comprising paths activated by the scan
pattern from the identified fault site to end points of the
corresponding paths; and concatenating the backward paths and forward paths into
the paths.

12. The method of claim 11, wherein identifying each backward path for each scan pattern and each fault site comprises:
    detecting a transition at the identified fault site activated by the scan pattern;
    identifying driving gates associated with the transition, wherein the transition is detected at respective outputs of the driving gates; and
    assembling the identified driving gates into the backward path.

13. The method of claim 11, wherein identifying each forward path for each scan pattern and each fault site comprises:
    detecting a transition at the identified fault site activated by the scan pattern;
    identifying fanout gates associated with the transition, wherein the transition is propagated through the fanout gates; and
    assembling the fanout gates into the forward path.

14. Non-transitory tangible computer readable media that includes instructions for execution, which when executed by a processor, performs operations comprising:
    analyzing scan patterns for testing a circuit of a device under test;
    identifying paths in the circuit that are activated by the scan patterns;
    determining behavior of the paths at different test corners;
    generating a histogram for each scan pattern, the histogram comprising a representation of a distribution of paths exhibiting worst-case behavior at corresponding test corners;
    generating an ordered set of scan pattern-test corner combinations based on the histogram;
    selecting a threshold for the ordered scan pattern-test corner combinations based on quality metrics, wherein the ordered scan pattern-test corner combinations above the threshold are associated with higher defect levels and the ordered scan pattern-test corner combinations below the threshold are associated with lower defect levels; and
    generating an ordered test set comprising the ordered scan pattern-test corner combinations with the selected threshold, wherein a test instrument tests the device under test according to the ordered test set, wherein the tests are performed at the test corners listed above the selected threshold using the corresponding scan patterns of the scan pattern-test corner combinations.

15. The media of claim 14, wherein generating the histogram comprises:
    identifying a worst-case test corner for each path, wherein the worst-case test corner comprises one of the different test corners at which the path exhibits worst-case behavior; and
    determining a number of paths exhibiting worst-case behavior at each test corner for each scan pattern.

16. The media of claim 15, wherein identifying the paths comprises:
    extracting the scan patterns from an ATPG database;
    extracting the circuit's design from at least electronic design automation tools;
    identifying fault sites in the design;
    for each scan pattern and each fault site, identifying backward paths, comprising paths activated by the scan pattern from the identified fault site to starting points of the corresponding paths;
    for each scan pattern and each fault site, identifying forward paths, comprising paths activated by the scan pattern from the identified fault site to end points of the corresponding paths; and
    concatenating the backward paths and forward paths into the paths.

17. An apparatus, comprising:
    a memory element for storing data; and
    a processor, wherein the processor executes instructions associated with the data, wherein the processor and the memory element cooperate, such that the apparatus is configured for:
        analyzing scan patterns for testing a circuit of a device under test;
        identifying paths in the circuit that are activated by the scan patterns;
        determining behavior of the paths at different test corners;
        generating a histogram for each scan pattern, the histogram comprising a representation of a distribution of paths exhibiting worst-case behavior at corresponding test corners;
        generating an ordered set of scan pattern-test corner combinations based on the histogram;
        selecting a threshold for the ordered scan pattern-test corner combinations based on quality metrics, wherein the ordered scan pattern-test corner combinations above the threshold are associated with higher defect levels and the ordered scan pattern-test corner combinations below the threshold are associated with lower defect levels;
        generating an ordered test set comprising the ordered scan pattern-test corner combinations with the selected threshold; and
        feeding the ordered test set to a test instrument, wherein the test instrument tests the device under test according to the ordered test set, wherein the tests are performed at the test corners listed above the selected threshold using the corresponding scan patterns of the scan pattern-test corner combinations.

18. The apparatus of claim 17, wherein identifying the paths comprises:
    extracting the scan patterns from an ATPG database;
    extracting the circuit's design from at least electronic design automation tools;
    identifying fault sites in the design;
    for each scan pattern and each fault site, identifying backward paths, comprising paths activated by the scan pattern from the identified fault site to starting points of the corresponding paths;
    for each scan pattern and each fault site, identifying forward paths, comprising paths activated by the scan pattern from the identified fault site to end points of the corresponding paths; and
    concatenating the backward paths and forward paths into the paths.

19. The apparatus of claim 18, wherein identifying each backward path for each scan pattern and each fault site comprises:
    detecting a transition at the identified fault site activated by the scan pattern;

identifying driving gates associated with the transition, wherein the transition is detected at respective outputs of the driving gates; and assembling the identified driving gates into the backward path.

20. The apparatus of claim 18, wherein identifying each forward path for each scan pattern and each fault site comprises:

detecting a transition at the identified fault site activated by the scan pattern;

identifying fanout gates associated with the transition, wherein the transition is propagated through the fanout gates; and assembling the fanout gates into the forward path.

* * * * *